(12) United States Patent
Petrovic et al.

(10) Patent No.: US 6,453,749 B1
(45) Date of Patent: *Sep. 24, 2002

(54) PHYSICAL SENSOR COMPONENT

(75) Inventors: Slobodan Petrovic; Holly Jean Miller, both of Scottsdale, AZ (US)

(73) Assignee: Motorola, Inc., Schaumburg, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/429,099

(22) Filed: Oct. 28, 1999

(51) Int. Cl.[7] .................................................. G01L 9/00
(52) U.S. Cl. ......................................................... 73/754
(58) Field of Search ........................... 73/756 DR, 715, 73/714, 707, 700, 718, 724, 723, 717, 754

(56) References Cited

U.S. PATENT DOCUMENTS

| | | | | |
|---|---|---|---|---|
| 3,574,284 A | * | 4/1971 | Thordarson et al. | 73/406 |
| 3,619,742 A | * | 11/1971 | Rud, Jr. et al. | 317/246 |
| 4,034,609 A | * | 7/1977 | Fuller | 73/335 |
| 4,177,496 A | * | 12/1979 | Bell et al. | 361/283 |
| 4,571,244 A | * | 2/1986 | Knighton | 604/118 |
| 4,686,764 A | * | 8/1987 | Adams et al. | 29/592 |
| 4,909,070 A | * | 3/1990 | Smith | 73/73 |
| 4,993,265 A | * | 2/1991 | Koen et al. | 73/706 |
| 5,308,939 A | * | 5/1994 | Sasaki | 200/83 R |
| 5,436,491 A | * | 7/1995 | Hase et al. | 257/417 |
| 5,600,071 A | | 2/1997 | Sooriakumar et al. | 73/721 |
| 5,625,151 A | * | 4/1997 | Yamaguchi | 73/716 |
| 5,889,211 A | | 3/1999 | Maudie et al. | 73/720 |
| 5,895,859 A | | 4/1999 | Sawada et al. | |
| 5,900,554 A | | 5/1999 | Baba et al. | |
| 5,914,033 A | * | 6/1999 | Carlsson | 210/90 |
| 6,047,604 A | * | 4/2000 | Auburger et al. | 73/756 |
| 6,191,359 B1 | * | 2/2001 | Sengupta et al. | 174/52.3 |

FOREIGN PATENT DOCUMENTS

| | | |
|---|---|---|
| DE | 1962603 A1 | 1/1998 |
| EP | 0677726 A2 | 10/1995 |
| EP | 0736757 A1 | 10/1996 |
| EP | 0762096 A1 | 3/1997 |
| FR | 2686692 A1 | 7/1993 |
| WO | WO89/08244 | 9/1989 |
| WO | WO96/03629 | 2/1996 |

* cited by examiner

*Primary Examiner*—Max Noori
(74) *Attorney, Agent, or Firm*—Robert L. King

(57) ABSTRACT

A physical sensor component includes a housing (110) having a cavity (112), a pressure sensor device (120) mounted in the cavity of the housing, and a chemically selective and physically selective filter (153) overlying the cavity of the housing and separated from the pressure sensor device.

16 Claims, 1 Drawing Sheet

PHYSICAL SENSOR COMPONENT

FIELD OF THE INVENTION

This invention relates, in general, to electronics and, more particularly, to physical sensor components.

BACKGROUND OF THE INVENTION

Physical sensor components such as silicon pressure sensors can be used in automotive, industrial, consumer white goods, and various other applications. To provide compatibility with different chemical environments, encapsulants have been used to protect the silicon pressure sensor. However, none of these encapsulants are entirely impermeable to corrosive solutions. Furthermore, the encapsulants do not completely satisfy the customers' stringent reliability requirements, and the encapsulants also do not enable the silicon pressure sensors to remain fully operative during their expected lifetimes. A common failure mechanism for a silicon pressure sensor having a prior art encapsulant involves diffusion of the corrosive media followed by the delamination of the encapsulant from the silicon pressure sensor. This delamination exposes portions of the sensor that subsequently corrode from the direct exposure to the chemical environments. In addition to this common failure mechanism, most of the encapsulants produce adverse mechanical effects on the performance of the silicon pressure sensor, and these adverse mechanical effects severely limit the use of the sensor.

Accordingly, a need exists for an improved physical sensor component that provides effective corrosion protection while not introducing adverse mechanical effects on the performance of the component.

Figure 1:
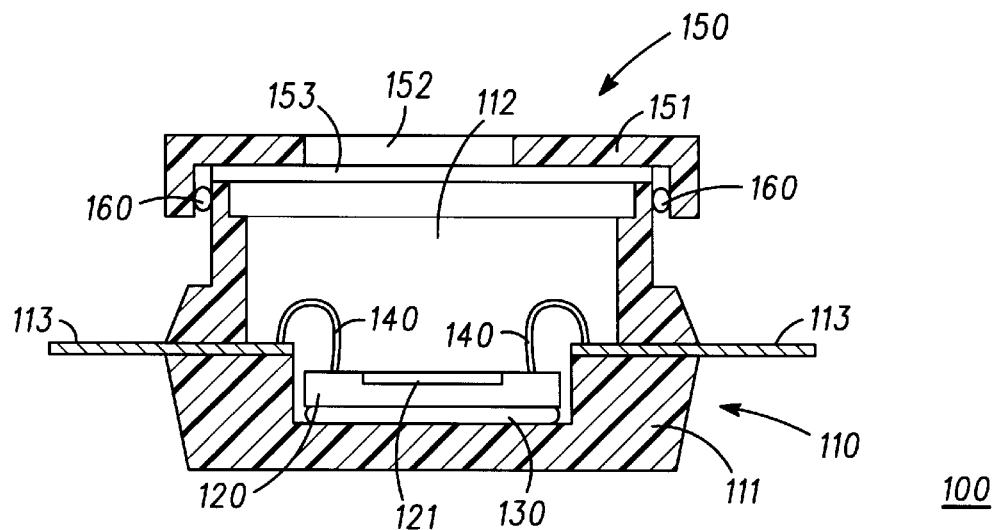
FIG. 1 illustrates a cross-sectional view of a physical sensor component in accordance with a first embodiment of the present invention.

The present invention will be better understood from a reading of the following detailed description, taken in conjunction with the accompanying drawing figures. For simplicity and clarity of illustration, elements in the figures are not necessarily drawn to scale, and the same reference numerals in different figures denote the same elements. Additionally, descriptions and details of well-known features and processing techniques are omitted to avoid unnecessarily obscuring the present invention.

DETAILED DESCRIPTION OF THE DRAWINGS

FIG. 1 illustrates a cross-sectional view of a physical sensor component 100 in accordance with a first embodiment of the present invention. Component 100 includes a support structure or housing 110. Housing 110 includes a portion 111 that defines a recess or cavity 112 within housing 110. Housing 110 should be comprised of a material that is resistant to or that is inert in the environment in which component 100 is to be used. In this embodiment, portion 111 is comprised of an electrically insulating material such as, for example, a plastic. Housing 110 also includes electrical leads 113 that extend from within cavity 112 through the walls of portion 111.

Component 100 also includes a physical sensor device 120. Device 120 is preferably an electro-mechanical device or a transducer such as, for example, a pressure sensor. Device 120 includes a physical sensing portion 121. In this embodiment, portion 121 represents a flexible diaphragm in the pressure sensor. Device 120 is located in cavity 112 and is mounted to portion 111 of housing 110. As an example, an adhesive 130 can be used to physically couple device 120 to portion 111. The term "couple" as used herein is defined as directly or indirectly connected in a mechanical, magnetic, electrostatic, or other manner. Device 120 is electrically coupled to leads 113. As an example, wire bonds 140 can be used to provide the electrical coupling.

Component 100 also includes a lid 150 that covers cavity 112 and housing 110. Lid 150 protects device 120 from the environment outside of housing 110 while permitting pressure from the environment to pass through lid 150 and into cavity 112. This pressure within recess 112 is subsequently detected by device 120.

In this embodiment, lid 150 is permanently or fixedly coupled to housing 110. However, in an alternative embodiment, lid 150 can be replaced by another lid if lid 150 becomes damaged during the use of component 100. Lid 150 is fastened or secured to housing 110 by a mechanism 160, which can be, for example, chemical, mechanical, magnetic, ultrasonic, heat stake or any combination thereof. In a preferred embodiment, mechanism 160 provides a hermetic seal around the perimeter of housing 110. In this embodiment, mechanism 160 can be comprised of an adhesive such as, for example, an epoxy.

Lid 150 includes a port 151 having a hole 152 overlying cavity 112. A filter 153 is placed adjacent to hole 152 to form a lid assembly. The lid assembly is placed over cavity 112 to seal cavity 112. Filter 153 is preferably fixedly coupled to the underside of port 151, which faces towards device 120 and cavity 112. As an example, filter 153 can be ultrasonically bonded to port 151. Lid 150, filter 153, and mechanism 160 should be comprised of materials that are resistant to or that are inert in the environment in which component 100 is to be used.

Filter 153 is preferably a chemically selective and physically selective filter. In this embodiment, filter 153 is porous to permit pressure in the environment outside of cavity 112 to move through filter 153 and into cavity 112, and vice versa. Also in this embodiment, filter 153 is comprised of a polymer resin comprised of fluorine, such as poly-tetra-fluoro-ethylene. Furthermore, filter 153 is preferably chemically treated to be both hydrophobic and oleophobic. With these characteristics, filter 153 is capable of preventing water and oil from entering cavity 112. As an example, filter 153 can be commercially purchased from Donaldson Europe N.V. in Leuven, Belgium.

Components in the prior art typically encapsulate a pressure sensitive device with a prior art gel that transmits pressure to provide the protection afforded by filter 153. However, the prior art pressure sensitive encapsulation introduces an offset in the electrical output of the pressure sensitive device. Furthermore, the sensor span or sensitivity and temperature coefficients can be altered with the prior art gels. This effect on device output is highly undesirable, especially because it can be difficult to compensate. Component 100 solves the problem of the prior art by separating or spacing apart filter 153 and the pressure sensitive portion 121 of device 120 such that filter 153 does not directly contact physical sensing portion 121 of device 120. Furthermore, in the preferred embodiment, lid. 150 provides superior protection from the environment for device 120 compared to the prior art gels, and lid 150 is also more versatile than prior art gels because lid 150 is replaceable while the prior art gels are not replaceable.

Figure 2:
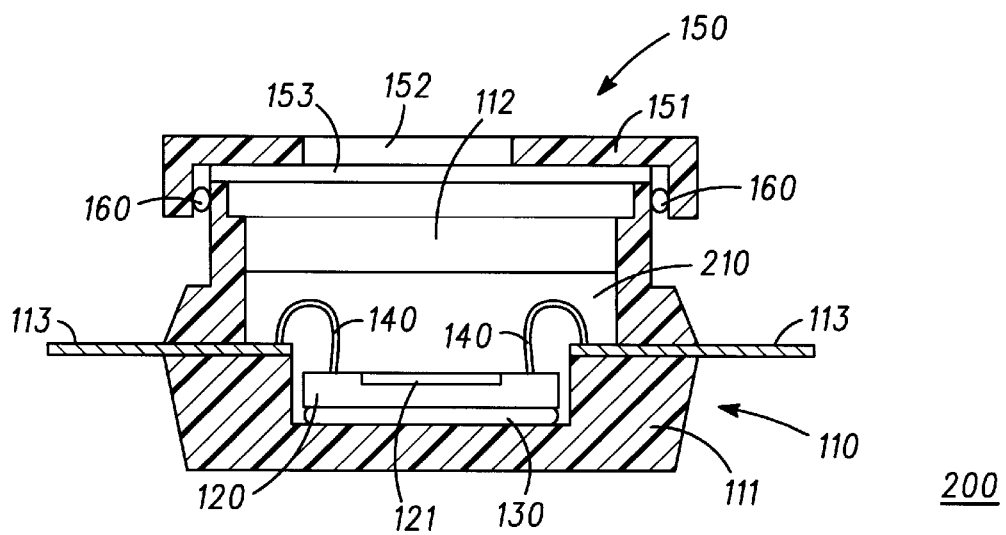
FIG. 2 illustrates a cross-sectional view of a physical sensor component in accordance with a second embodiment of the present invention.

FIG. 2 illustrates a cross-sectional view of a physical sensor component 200, which is similar to component 100 of FIG. 1 in accordance with a second embodiment of the present invention. Component 200 in FIG. 2 includes, among other features, a passivation layer 210 in cavity 112. Layer 210 is located between filter 153 and device 120. Layer 210 covers and provides additional protection for the metallic portions of component 200 against corrosion resulting from the environment outside of cavity 112 that inadvertently pass through filter 153 and into the cavity 112.

Layer 210 may overlie portion 121 of device 120, but layer 210 can be thinner than the encapsulants used in the prior art because of the additional protection provided by lid 150. In this manner, the prior art problem of the variable offset in the output of the pressure sensitive device is alleviated. In this embodiment, layer 210 should be a flexible material in order to permit device 120 to sense the pressure through layer 210. As an example, layer 210 can be comprised of a dimethyl silicone, fluorosilicone, or fluorocarbon gel or a parylene film.

Therefore, an improved physical sensor component is provided to overcome the disadvantages of the prior art. The component described herein is protected against corrosion by a technique that does not introduce adverse mechanical effects on the performance of the pressure sensing device. Accordingly, the component described herein has fewer limitations as to its use.

The disclosure of the present invention described herein is enabled and can be realized and practiced without undue experimentation. Although the best mode of carrying out the present invention contemplated by the inventors is disclosed hereinabove, practice of the present invention is not limited thereto. Furthermore, while the present invention has been particularly shown and described mainly with reference to specific embodiments, it will be understood by those skilled in the art that various changes in form and detail may be made to the embodiments herein without departing from the spirit or scope of the present invention. For instance, the numerous details set forth herein such as, for example, the material compositions are provided to facilitate the understanding of the present invention and are not provided to limit the scope of the present invention. Furthermore, the chemically selective and physically selective filter can be modified to filter out other chemicals in addition to water and oil. These other chemicals can include, but are not limited to, acidic or alkaline aqueous solutions, organic solvents, or vapors or mixtures thereof. Moreover, a chemically selective and physically selective filter can be directly attached to the housing without the use of a port.

Accordingly, the disclosure of the present invention is not intended to be limiting. Instead, the disclosure of the present invention is intended to be illustrative of the scope of the present invention. It is intended that the scope of the present invention shall be limited only to the extent required by the appended claims and the rules and principles of applicable law. The appended claims are not to be interpreted as including means-plus-function limitations, unless such a limitation is expressly recited in a given claim using the phrase "means for".

What is claimed is:

1. A physical sensor component comprising:
    a housing having one opening to a cavity and external leads extending substantially planarly in at least a portion of the housing to first and second opposite sides that are sides that are adjacent to the one opening, the housing having a detachable lid that is hermetically sealed to a remainder portion of the housing;
    a pressure sensor semiconductor device having a first side mounted to a back surface of the housing that faces the one opening in the cavity and a second side electrically coupled to the external leads; and
    a porous filter that is chemically treated to be both hydrophobic and oleophobic to block both water and oil external to the housing from entering the cavity, the porous filter overlying the one opening to the cavity of the housing for allowing only the second side of the pressure sensor semiconductor device to receive a pressure within the cavity, environment pressure within the cavity being sensed without use of a gel in the cavity.

2. The physical sensor component of claim 1 wherein the porous filter is ultrasonically bonded to the detachable lid.

3. The physical sensor component of claim 1 wherein the porous filter is permanently affixed to the housing.

4. The physical sensor component of claim 1 wherein the porous filter is replaceable by removing the detachable lid.

5. The physical sensor component of claim 1 wherein the porous a filter is comprised of a polymer resin comprising fluorine.

6. The physical sensor component of claim 5 wherein the polymer resin is further comprised of poly-tetra-fluoro-ethylene.

7. The physical sensor component of claim 1 wherein the cavity is reduced in volume by placing a passivation layer around the pressure sensor semiconductor device to protect any metallic portions of the pressure sensor semiconductor device from corrosion.

8. A physical sensor component comprising:
    a support structure having external leads, an opening to a cavity and a removable lid that is hermetically sealed to the support structure;
    a semiconductor physical sensor device mounted to a surface of the support structure within the cavity and electrically contacting the external leads, the cavity completely surrounding the semiconductor physical sensor device except on one side thereof, the semiconductor physical sensor device having a first surface that is electrically coupled via conductors to the leads, the first surface being closer to a back side of the physical sensor component than contact points on the external leads with the conductors; and
    a porous filter that is both hydrophobic and oleophobic and positioned over the one opening and comprised of a polymer resin for allowing the semiconductor physical sensor device to receive a pressure through the one opening to the cavity without using gel within the cavity, the porous filter blocking both water and oil.

9. The physical sensor component of claim 8 wherein the porous filter is replaceable.

10. The physical sensor component of claim 8 wherein the removable lid further comprises a removable port having a hole as the opening to the cavity, wherein the removable port covers and is coupled to the support structure and wherein the porous filter is coupled to the removable port.

11. The physical sensor component of claim 8 wherein the porous filter is ultrasonically bonded to the removable lid.

12. A physical sensor component comprising:

a plastic housing having a recess and a single opening;

a semiconductor pressure sensor device located in the recess and mounted to the plastic housing, the semiconductor pressure sensor device being surrounded on all sides except one by a cavity of air, the cavity being void of any gel material and pressure being sensed using only air as a transmission medium; and a porous poly-tetra-fluoro-ethylene filter overlying the recess to prevent passage of water and oil to the semiconductor pressure sensor device from a water and oil environment outside of the plastic housing while permitting pressure from the environment to pass through the porous poly-tetra-fluoro-ethylene filter into the recess of the plastic housing and to the semiconductor pressure sensor device, the plastic housing having a side that permits access to the recess for selective replacement of the porous poly-tetra-fluoro-ethylene filter.

13. The physical sensor component of claim 12 further comprising electrical leads that are electrically connected to the semiconductor pressure sensor device within the cavity of air.

14. The physical sensor component of claim 12 wherein both the porous, poly-tetra-fluoro-ethylene filter and the side of the plastic housing are replaceable.

15. The physical sensor component of claim 12 wherein the side of the plastic housing further comprises a port covering the recess of the plastic housing wherein the porous, poly-tetra-fluoro-ethylene filter is fixedly coupled to the port and wherein the port is coupled to the plastic housing.

16. The physical sensor component of claim 15 wherein the port and the porous, poly-tetra-fluoro-ethylene filter are detachable from the plastic housing and are replaceable.

* * * * *

UNITED STATES PATENT AND TRADEMARK OFFICE
CERTIFICATE OF CORRECTION

PATENT NO. : 6,453,749 B1
DATED : September 24, 2002
INVENTOR(S) : Slobodan Petrovic et al.

It is certified that error appears in the above-identified patent and that said Letters Patent is hereby corrected as shown below:

<u>Title page,</u>
Item [75], Inventors, add -- David J. Monk, Mesa, AZ (US) --

Signed and Sealed this

Twenty-ninth Day of July, 2003

JAMES E. ROGAN
*Director of the United States Patent and Trademark Office*